(12) United States Patent
Gourmel et al.

(10) Patent No.: US 11,501,493 B2
(45) Date of Patent: *Nov. 15, 2022

(54) SYSTEM FOR PROCEDURAL GENERATION OF BRAID REPRESENTATIONS IN A COMPUTER IMAGE GENERATION SYSTEM

(71) Applicant: UNITY TECHNOLOGIES SF, San Francisco, CA (US)

(72) Inventors: Olivier Gourmel, Wellington (NZ); Paolo Selva, Wellington (NZ)

(73) Assignee: UNITY TECHNOLOGIES SF, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/098,203

(22) Filed: Nov. 13, 2020

(65) Prior Publication Data

US 2021/0375039 A1 Dec. 2, 2021

Related U.S. Application Data

(60) Provisional application No. 63/032,413, filed on May 29, 2020.

(51) Int. Cl.
| | |
|---|---|
| *G06T 17/10* | (2006.01) |
| *G06T 19/00* | (2011.01) |
| *G06T 17/20* | (2006.01) |
| *G06T 13/40* | (2011.01) |

(52) U.S. Cl.
CPC .............. *G06T 17/10* (2013.01); *G06T 13/40* (2013.01); *G06T 17/20* (2013.01); *G06T 19/00* (2013.01)

(58) Field of Classification Search
None
See application file for complete search history.

(56) References Cited

U.S. PATENT DOCUMENTS

| | | | |
|---|---|---|---|
| 7,418,371 B2 * | 8/2008 | Choe | G06T 11/00 |
| | | | 703/2 |
| 10,685,499 B1 * | 6/2020 | Khadiyev | G06T 13/40 |
| 2016/0078675 A1 * | 3/2016 | Bowline | G06T 13/40 |
| | | | 345/423 |
| 2021/0241510 A1 * | 8/2021 | Kuribayashi | G06T 3/40 |

FOREIGN PATENT DOCUMENTS

WO WO2006/104309 10/2006

OTHER PUBLICATIONS

Hu, Liwen, et al. "Capturing braided hairstyles." ACM Transactions on Graphics (TOG) 33.6 (2014): 1-9 (Year: 2014).*

(Continued)

*Primary Examiner* — Nurun Flora
(74) *Attorney, Agent, or Firm* — Haynes and Boone, LLP

(57) ABSTRACT

A computer-implemented method for procedurally simulating braided strands of fibers may include, under the control of one or more computer systems configured with executable instructions, obtaining a set of parameters of the braided strands of the fibers, the set of parameters indicating a braid spine, generating, based at least in part on the set of parameters, a set of interlacing strand spines that follow the braid spine within a tolerance according to the set of parameters, and computing a set of first geometric structures corresponding to the set of interlacing strand spines.

14 Claims, 9 Drawing Sheets

(56) References Cited

OTHER PUBLICATIONS

Hachmann, Hendrik, Maren Awiszus, and Bodo Rosenhahn. "3D braid guide hair reconstruction using electroluminescent wires." The Visual Computer 34.6 (2018): 793-804 (Year: 2018).*
Sun, Chao, and Won-Sook Lee. "Braid Hairstyle Recognition based on CNNs." VISIGRAPP (4: VISAPP). 2017 (Year: 2017).*
Zhang, Hui, Yiwen Zhong, and Jade Jiang. "Visualizing knots and braids with touchable 3D manipulatives." 2016 IEEE Pacific visualization symposium (PacificVis). IEEE, 2016 (Year: 2016).*
Jung, Seunghwan, and Sung-Hee Lee. "Hair modeling and simulation by style." Computer Graphics Forum. vol. 37. No. 2. 2018 (Year: 2018).*
Gaoxiang Zeng et al: "Braiding hair by braid theory",Virtual Reality Software and Technology, ACM, 2 Penn Plaza, Suite 701 New York NY 10121-0701 USA, Nov. 11, 2014 (Nov. 11, 2014), pp. 215-216, XP058061751, DO I: 10.1145/2671015.2674962 ISBN: 978-1-4503-3253-8 abstract sections 2, 3 figures 2, 3 the whole document.
Aneta V: 11 Model Braid in Autodesk 3ds Max 11 Dec. 22, 2018 (Dec. 22, 2018), p. 1, XP054981403, Retrieved from the Internet: URL:https://www.youtube.com/watch?v=DwnxBbR3oG4 [retrieved on Feb. 15, 2021] 0:00-3:00 the whole document.
Reza Asaie: 11 3dsmax braiding hair script 11, Nov. 28, 2016 (Nov. 28, 2016), p. 1, XP054981409, Retrieved from the Internet: URL:https://www.youtube.com/watch?v=ek SS d0luo [retrieved on Feb. 16, 2021] 0:00-3:10 the whole document.

\* cited by examiner fibers with flyaway tips 902

SYSTEM FOR PROCEDURAL GENERATION OF BRAID REPRESENTATIONS IN A COMPUTER IMAGE GENERATION SYSTEM

CROSS-REFERENCE TO RELATED APPLICATIONS

This application claims priority to and the benefit of U.S. Provisional Patent Application No. 63/032,413, filed May 29, 2020, which is incorporated herein by reference in its entirety.

FIELD OF THE INVENTION

The present disclosure generally relates to digital animation and more particularly to procedural generation of braided fibers.

BACKGROUND

As digital animation in movies and games has increased in popularity, so has the complexity of the models and the virtual environments in which they interact. Various tools have been developed to enhance the realism of models, but creating braids, such as hair braids, heretofore has been a laborious manual process, especially in scenes with many characters having braided hair. Furthermore, modifying the braids resulting from such efforts is likewise a manual process and can be quite difficult and time-consuming.

SUMMARY

An animation system provides tools for animators to specify details of braided hair and generates animation aligned with those details, without requiring then animator to specify the behavior and movement of each strand of hair in the braid. In some animated sequences, individual strands might appear to be loosely braided together to form individual centerlines for polygonal meshes used to form braided hair. The animation system can then generate more realistic scenes involving braided hair with a much simpler animator user interface for specifying that braided hair. Braids might be modeled as coextensive, proximate, or overlapping CG tubes (hulls) or other computer-generated structures such as a wire frame that define flow and position of a braided hair within a braid cluster and flyaway hairs. The hulls may be used to allow for real-time braid rendering. The hair fibers may then be generated and then rendered using the tubes as the geometric input.

The method and apparatus can be generalized to other animation tasks other than hair, such as other fiber objects with a geometric structure having a length multiple times longer than its width that can be woven or interlaced into a braid. For hair, the tubes might be used to define the hair connections to the scalp.

Where there are many hairs or fibers to be used and they are to be placed in physically realizable positions (e.g., not having hairs appear to pass through solid objects), it is often more practical to have the creator input high-level parameters and have a computer process execute a procedure with those high-level parameters to place the hairs or fibers.

With braiding, a strand may be a single length of rope or thread, or, as another example, may be a gathered section of hundreds of hairs or other fibers. In some examples, a strand (also referred to as a partition or section) might refer to a set of one or more fibers to be woven/interlaced into a braid. A fiber may be a representation of a physical item, such as a hair, a rope, a thread, a hose, or other long, thin, flexible item that can be woven into a braid. In some examples, a braid refers to a weave of three or more interlaced strands. A procedurally generated braid described in the present disclosure may follow braid spine that runs between a set of strand spines.

In some examples, a "strand tube" (or just "tube") refers to a long, hollow, cylindrical, bendable geometric structure that represents the area of space that a strand occupies.

Techniques and systems described below relate to generating braids for digital animation. In one example, a set of parameters for braided fiber is obtained. In the example, the set of parameters indicates a braid spine. Still in the example, a set of interlacing strand spines that follow the braid spine within a tolerance according to the set of parameters is generated based at least in part on the set of parameters. Lastly in the example, a set of geometric structures corresponding to the set of strand spines is computed.

In a specific embodiment, an animator (human or a computer process) specifies a centerline for a braid, which might be a piecewise linear curve. Around this centerline, strand paths might be specified, which represent centerlines for each strand of a braid. An animation process might then determine an expansion of polygonal meshes about each of the centerlines until they reach a target radius or hit another mesh. A second render of the mesh might be used to create "flyaway fibers" that are hairs that do not fully remain inside the mesh geometric structure or hull of a braid or a strand. Each hair fiber can be assigned a position in each mesh geometric structure. Each point of the fibers might be computed by interpolating vertices of each associated geometric structure, with two positions computed, one position for a main geometric structure, and one for a flyaway geometric structure. The flyaway fiber positions might be randomly or pseudo-randomly generated to generate random flyaway fibers.

An animation tool might be used to create base curve content (centerlines) with braid parameters ("primvars") which can be sent to a real-time renderer.

Interpolation of the geometric structure hulls (strand hulls and flyaway hulls) can be done to compute the fiber positions, with one geometric structure/hull for the braid and another geometric structure/hull for generating flyways. Using hulls can allow for faster simulation and the use of geometric structures, geometry of the strand and flyaway hulls, can allow for real-time rendering.

BRIEF DESCRIPTION OF THE DRAWINGS

Various embodiments in accordance with the present disclosure will be described with reference to the drawings, in which.

DETAILED DESCRIPTION

Figure 1:
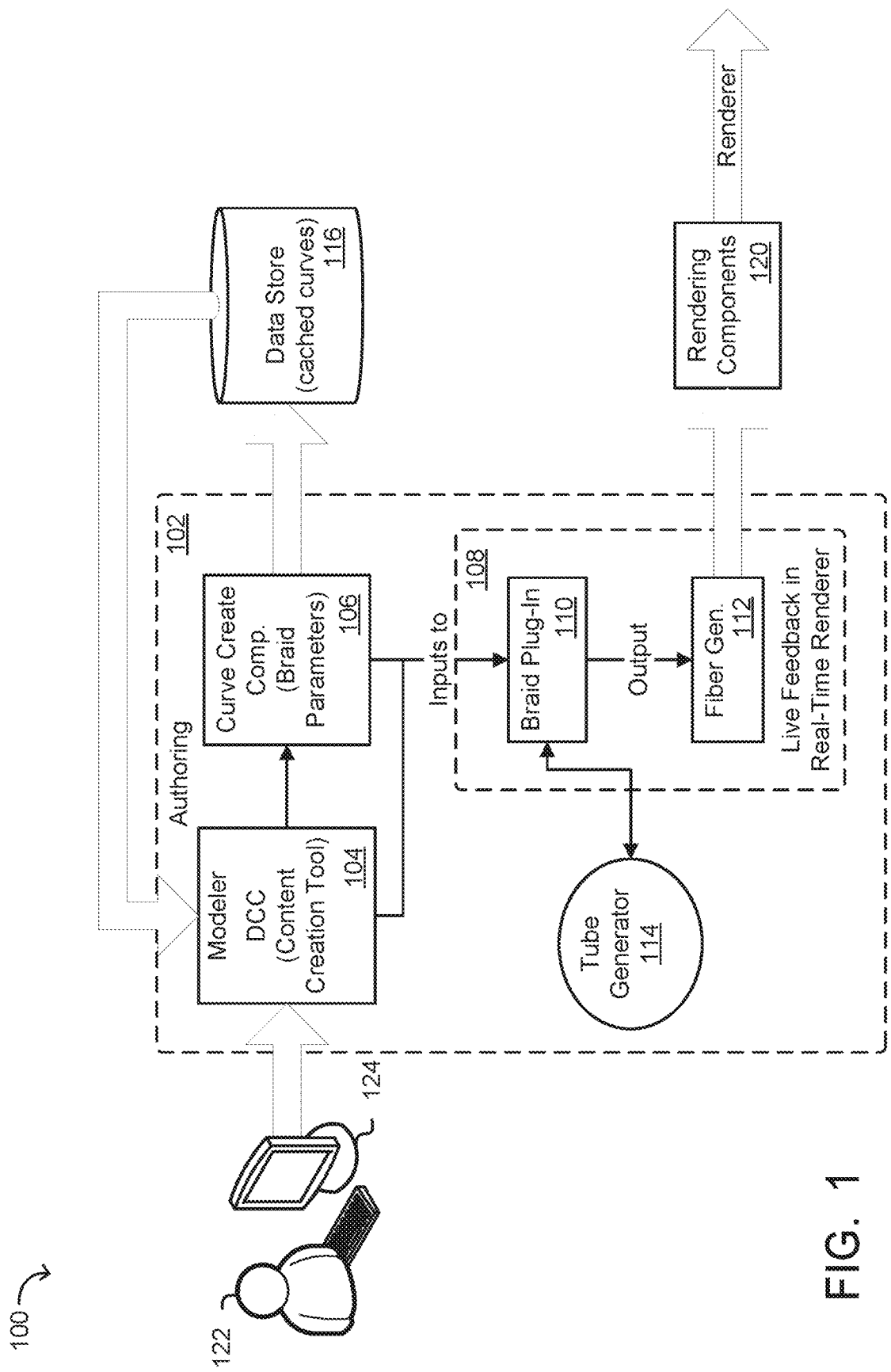
FIG. 1 illustrates a diagram of a system to procedurally generate braids in accordance with an embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

The present disclosure describes techniques for simulating braided strands of fibers in response to receiving a set of parameters that indicate a braid spine indicating a centerline or other position for all or a portion of the braided strands of fibers. Based on the set of parameters, a set of interlacing strand spines for centerlines or other positions of individual strands that follow the braid spine within a tolerance value may be generated. The tolerance value may be indicated by the set of parameters. A set of geometric structure objects may be generated to correspond to the set of strand spines.

In some examples, objects can be represented in computer memory by a data structure defining a mathematical representation of a two-dimensional (2D) or three-dimensional (3D) physical item or being. The representation might be stored as a mesh of vertices defining a tessellated manifold of a boundary for the object, and a texture for coloring that boundary. In some examples, a mesh can be represented in memory as data structures referring to a collection of vertices, edges, and/or faces that defines the shape of a polyhedral object in computer graphics modeling. In some examples, a scene can be represented as data structures referring to a virtual workspace for editing and/or rendering a 3D project. In some examples, an interface might be computer hardware or software designed to communicate information between hardware devices, between software programs, between devices and programs, or between a device and a user.

In some examples, a scene defining an arrangement of virtual objects, light sources, effects, etc. in a 2D or 3D space can be represented in computer memory be data defining geometric models. A digital artist or other creator might use a computer interface to specify details of a scene. This might be in the form of a virtual workspace for editing and/or rendering a 3D project. Some objects might be specified by a small number of parameters, such as primvars or geometric primitive variables, such as points, lines, line segments, planes, circles, ellipses, triangles or other polygons, and/or spline curves. In some examples, primvars alternatively or additionally include spheres, cubes, toroids, cylinders, pyramids, and/or polygon meshes. Portions of the scene might be described procedurally based on some primvars. For example, a spherical object might be represented in memory by primvars such as a center position, a radius, and a surface color, and a computer image generation system can generate imagery of that spherical object procedurally from the stored primvars.

In some examples, an "interface" refers to computer hardware or software designed to communicate information between hardware devices, between software programs, between devices and programs, or between a device and a user. In some examples, "communication" refers to a transmission and/or exchange of information. In some examples, a "display device" (also referred to as a "monitor" or "screen") refers to a device capable of representing information (e.g., words, numbers, drawings, images, etc.) visually (e.g., by a cathode-ray tube, liquid crystal display, light emitting diode, projection surface, etc.) that provides visual output from an image or video output device (e.g., computer, cable box, video camera, etc.).

While it might be possible for a creator to input details for each hair or fiber in a scene, where there are many hairs or fibers to be used and they are to be placed in physically realizable positions (e.g., not having hairs appear to pass through solid objects), it is often more practical to have the creator input high-level parameters and have a computer process execute a procedure with those high-level parameters to place the hairs or fibers.

With braiding, a strand may be a single length of rope or thread, or, as another example, may be a gathered section of hundreds of hairs or other fibers. In some examples, "fiber" refers to a geometric structure having a length multiple times longer than its width that can be woven or interlaced into a braid. In some examples, a strand (also referred to as a partition or section) might refer to a set of one or more fibers to be woven/interlaced into a braid. A fiber may be a representation of a physical item, such as a hair, a rope, a thread, a hose, or other long, thin, flexible item that can be woven into a braid. In some examples, a braid refers to a weave of three or more interlaced strands made up of fibers. A procedurally generated braid described in the present disclosure may follow braid spine that runs between a set of strand spines. A braid spine may correspond to a centerline in 2D or 3D space, such as a line having a curvature in 2D or 3D that defines a centerline to the braid of the three or more strands. A strand spine may similarly correspond to a centerline of an individual strand, which may be woven into the braid. In this regard, a strand spine may follow the braid spine, for example, by rotating helically or cylindrically around the braid spine, within a tolerance value. While centerlines may be used for strands, other positions of the strands in 2D or 3D space may also be used as points and/or lines of the curves for braids and strands.

In some examples, a strand tube refers to a long, hollow, cylindrical, bendable geometric structure that represents the area of space that a strand occupies (see tubes 206 of FIG. 2C). Individual fibers (except for flyaway fibers, described below) that make up the strand may be assigned a position within the tube. In some examples, a "hull" refers to an approximation of the outer surface of a bunch of accumulated surfaces (e.g., the surfaces of the tubes). Thus, a hull of a braid may comprise the surface of the braid as a whole of the accumulated surfaces of tubes of the strands. In some embodiments, if a fiber or flyaway fiber extends beyond the hull, it may not be rendered.

In some examples, a "flyaway" refers to a portion of fiber that is not wholly contained within a tube (e.g., a loose hair). In some examples, a "flyaway tube" refers to a long, hollow, cylindrical, bendable geometric structure larger than and encompasses the strand tube. Flyaway fibers located within the space between the surface of the flyaway tube and the strand tube may be rendered so as to appear to be stray fibers (see flyaway fibers 210 of FIG. 2D).

In some examples, a "braid spine" refers to a curve that defines a path for generating the braid. In some embodiments, the braid spine is a curve that runs through the center (e.g., centerline) of the braid (see a braid spine 202 of FIG. 2A). The braid spine may be specified by a digital artist and the system of the present disclosure may generate a braid to generally follow the path of the braid spine. In some examples, a "strand spine" refers to a curve that defines a path for a strand of the braid (see strand spines 204A-204C of FIG. 2B). The system of the present disclosure may generate the strand spine to generally follow the path of the braid spine as well as interlace between strand spines of other strands in the braid. The system of the present disclosure may generate a strand to generally follow the path of its respective strand spine.

Techniques and systems described below relate to generating braids for digital animation. In one example, a set of parameters for braided fiber is obtained. In the example, the set of parameters indicates a braid spine. Still in the example, a set of interlacing strand spines that follow the braid spine within a tolerance according to the set of parameters is generated based at least in part on the set of parameters. Lastly in the example, a set of tubes corresponding to the set of strand spines is computed.

In an example process, an animation system receives input specifying a centerline curve that defines the flow of a braid, determines a first polygonal mesh tube about the centerline that defines an outer boundary of the braid, and expands the tube until it reaches a target radius about the centerline or hits another tube. Then, another thicker second polygonal tube can be generated that is coextensive, proximate, or overlapping with the first tube and used to generate flyways. Hair fibers can be generated using the first tube braid geometry as input. Random flyaway hair fibers can be generated using the second tube braid geometry.

FIG. 1 illustrates an aspect of a system 100 in which an embodiment may be practiced. As illustrated in FIG. 1, system 100 may include an authoring system 102 whereby a user 122 may utilize a client device 124 to provide input to a modeler 104 for creation of digital animation content, such as a braid. The present disclosure describes the components of authoring system 102 for procedurally generating the braids, whereby modeler 104 causes curve creation component 106 to create curves for the braid parameters, whereupon curve creation component 106 can either store the braid parameters as cached curves in a data store 116 for later use (e.g., retrieved by the modeler an input to braid plug-in 110) or provide the braid parameters to a braid plug-in 110 in a real-time renderer 108. The stored braid parameters may include the initial braid centerline and any additional preferences and/or parameters for braid construction, such as fiber count, strand thickness, flyaways (for individual fibers and/or flyaway hulls), and the like. However, further parameters may also be stored for each braid if desired. Braid plug-in 110 may act as an interface to a tube generator 114 and fiber generator 112 (e.g., receiving input from modeler 104 and/or curve creation component 106). In some embodiments, tube generator 114 is integrated within braid plug-in 110. Once the fibers are added to the braid via fiber generator 112, the braid data may be output to rendering components 120 to be rendered.

Figure 5:
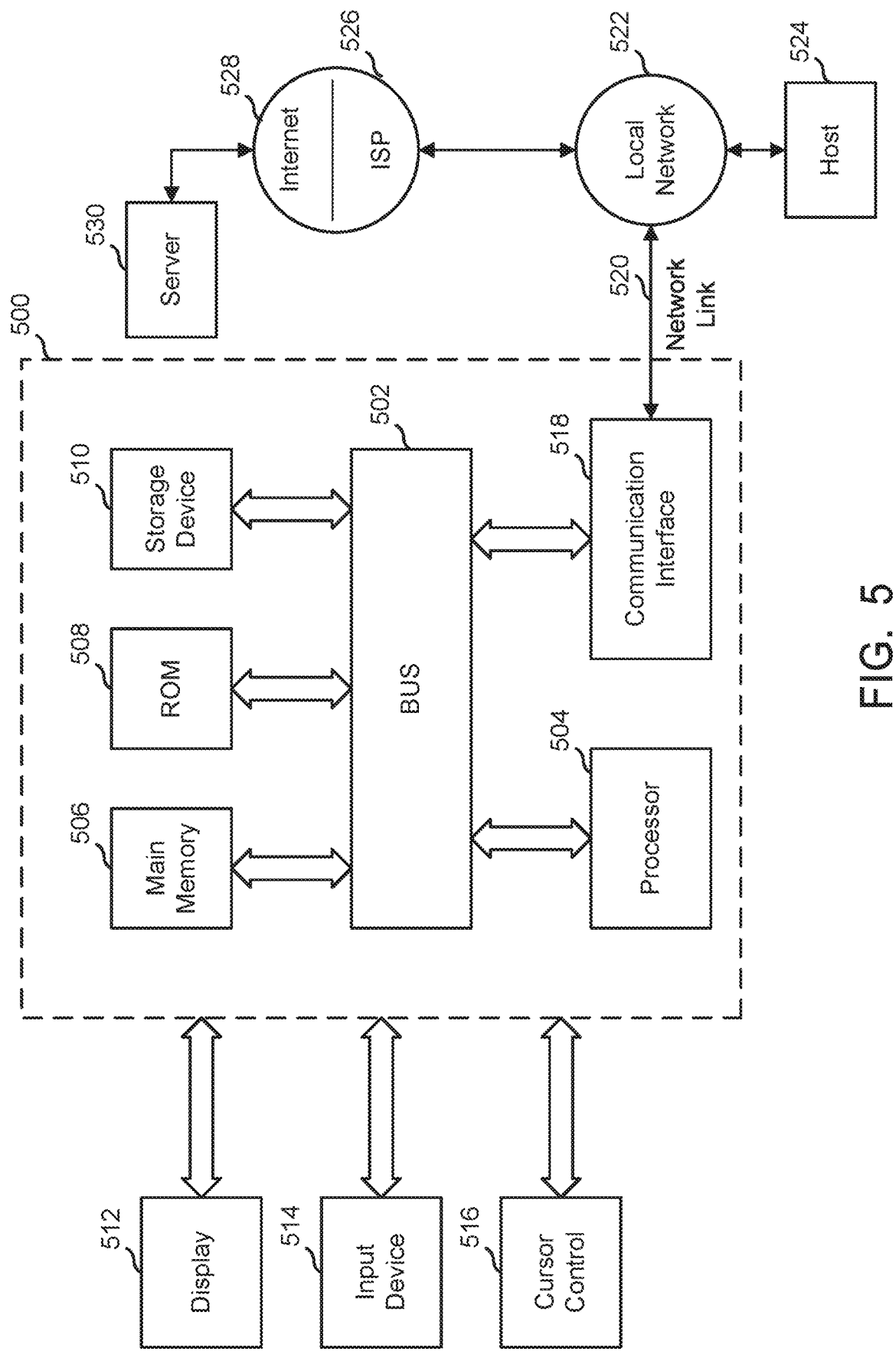
FIG. 5 illustrates a block diagram illustrating an example computer system upon which computer systems of the systems illustrated in FIGS. 1 and 6 may be implemented.

Authoring system 102 may be implemented by software executing on one or more computer systems (e.g., each like computer system 500 illustrated in FIG. 5). Further, authoring system 102 may be a component of visual content generation system 600 (see FIG. 6), which may be configured to receive the braid parameters as input and output one or more static images and/or one or more animated videos. The static image and/or the animated video may include one or more visual representations of braids.

Authoring system 102 may be a system configured to interact with digital artists, such as user 122 via client device 124, in order to create digital content (e.g., still images and/or animations). Authoring system 102 may be at least one member of visual content generation system 600 of FIG. 6. Authoring system 102 include one or more components, such as modeler 104, curve creation component 106, braid plug-in 110, fiber generator 112, and/or tube generator 114.

Modeler 104 may be a digital content creation (DCC) tool usable by user 122 via client device 124 to generate graphical assets (e.g., 2D and/or 3D animation or still content) for display on a display device. For example, modeler 104 may allow user 122 to define a scene to edit and implement visual content for a particular graphics project. Modeler 104 may allow user 122 to input one or more parameters for generating a braid, such as the braid depicted in FIGS. 2A-2D.

Curve creation component 106 may be a component of authoring system 102 that determines a braid spine (see braid spine 202 of FIG. 2A) based on input provided to modeler 104 by user 122. In some implementations, curve creation component 106 may further determine the strand spines (e.g., set of strand spines 204A-204C of FIG. 2B) from a set of parameters specified by user 122.

Real-time renderer 108 may comprise braid plug-in 110 and fiber generator 112, and may be configured to generate data, based at least in part on the curve information obtained from curve creation component 106 or modeler 104, sufficient to render a braid. In this regard, such information for a curve of a braid spine and other braid parameters may come directly from user 122 via client device 124 when modeling a new braid, or may be retrieved from data store 116 and provided to real-time rendered 108 from stored braid parameters.

Braid plug-in 110 may be an intermediary application running in authoring system 102 that coordinates tube generator 114 and fiber generator 112. For example, braid plug-in 110 may receive input (e.g., curve data and/or set of braid parameters) from curve creation component 106 and/or modeler 104, and provide information to tube generator 114 sufficient to generate a set of tubes or other structures, such as the set of tubes 206A-206B of FIG. 2C. Initially, the input may include curve data for a 2D or 3D curve that is to be used as a braid spine for the corresponding braid, which may be used to generate strand spines using additional braid parameters, procedural generation techniques for the braids and strands, and/or a tolerance value for generation for the strand spines that follow the braid spine. The additional braid parameters provided with the curve data may include a number of strands, a braid knot size, a braid or knot offset, a braid heterogeneity, a braid radius, a braid thickness, a strand radius, a strand thickness, a strand heterogeneity, a topology of the braid, a random seed value for fibers and/or other required seeds, a smoothness, a number of flyaways, a number of fibers, flyaway tip designations or number, a variance in flyaways, a length of flyaways, and/or clustering of flyaways.

Once tube generator 114 responds with the tube data, braid plug-in 110 may provide the tube data to fiber generator 112. Fiber generator 112 may be an application executing within authoring system 102 that fills a set of tubes determined by tube generator 114 with fibers. In some embodiments, fiber generator 112 generates fibers near the surface of each of the tubes (e.g., inside the tube, outside the tube, etc.) but does not necessarily fill the tube entirely with fibers and the strand may effectively be hollow. The fiber additionally or alternatively populate a set of flyaway tubes with flyaway fibers in accordance with the set of parameters of the braid. After fiber generator 112 has populated the set of tubes with fibers, the resultant braid data may be output to rendering components 120 or, alternatively, to be stored (e.g., in a data store same as or different from data store 116).

Figure 2:
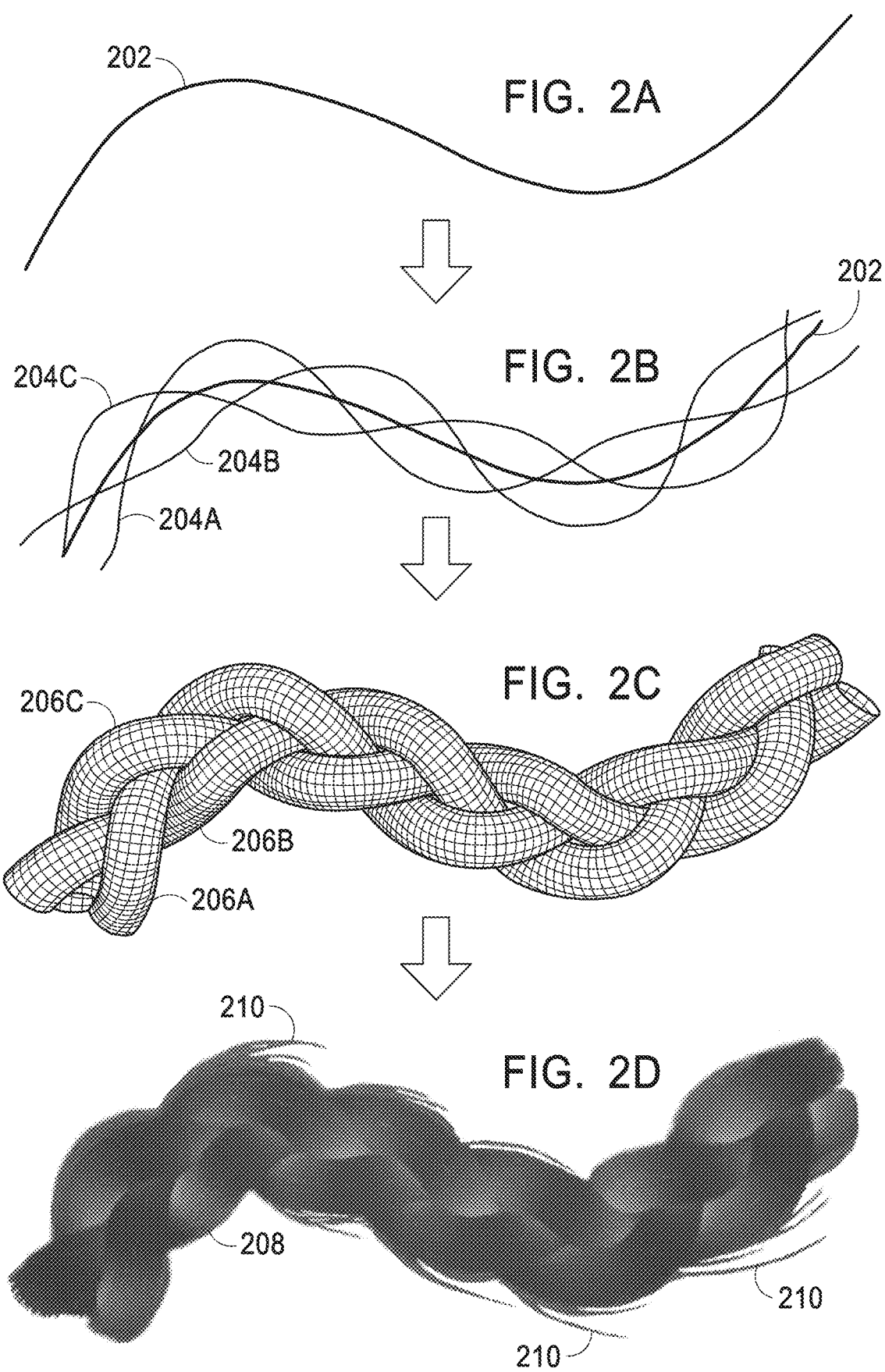
FIGS. 2A-2D illustrate stages of procedural braid generation in accordance with an embodiment.

Tube generator 114 may be a component of authoring system 102 that is configured to take curve data and the set of braid parameters provided by user 122 and generate a set of tubes (e.g., set of tubes 206A-206C of FIG. 2). For example, based on the braid spine, tube generator 114 may generate a set of strand spines in accordance with the set of parameters (e.g., number of knots, knot size, etc.), generate a set of strand tubes in accordance with the set of parameters (e.g., strand radius and/or thickness, amount of tapering, braid tightness, etc.), and may further generate a set of flyaway tubes for flyaway fibers (e.g., flyaway fibers 210 of FIG. 2D) in accordance with the set of parameters. In some embodiments, tube generator 114 may also determine placement of the fibers and/or flyaway fibers in accordance with the set of parameters (e.g., number of fibers, random seed for the flyaway fibers, flyaway probability, etc.).

Data store 116 may be a repository for storing curve data specifying the location, path, and orientation of braid spines and may further store sets of parameters for the braids. In this manner, the information sufficient to procedurally generate the braid specified by user 122 may be stored as a discrete set of values, and the braid may be generated on-the-fly as needed by providing the stored values for the braid to real-time renderer 108. In some implementations, data defining the strand spines and/or other data for the braid may be additionally stored in data store 116. In this regard, data store 116 need not store procedurally generated and/or rendered braids from input 2D or 3D curves or other curvatures. Instead, data store 116 may instead store braid parameters for the braid, including the underlying braid curve or spine and the additional parameters defining the braid, strands, flyaways, fibers, and the like. However, in other embodiments, data store 116 may store more or other data as necessary, including individual strand spines where desired. Thus, data for braid parameters stored to data store 116 may be sent to real-time renderer 108 for the on-the-fly rendering without needing large data structures for previously generated and/or rendered braids.

Figure 6:
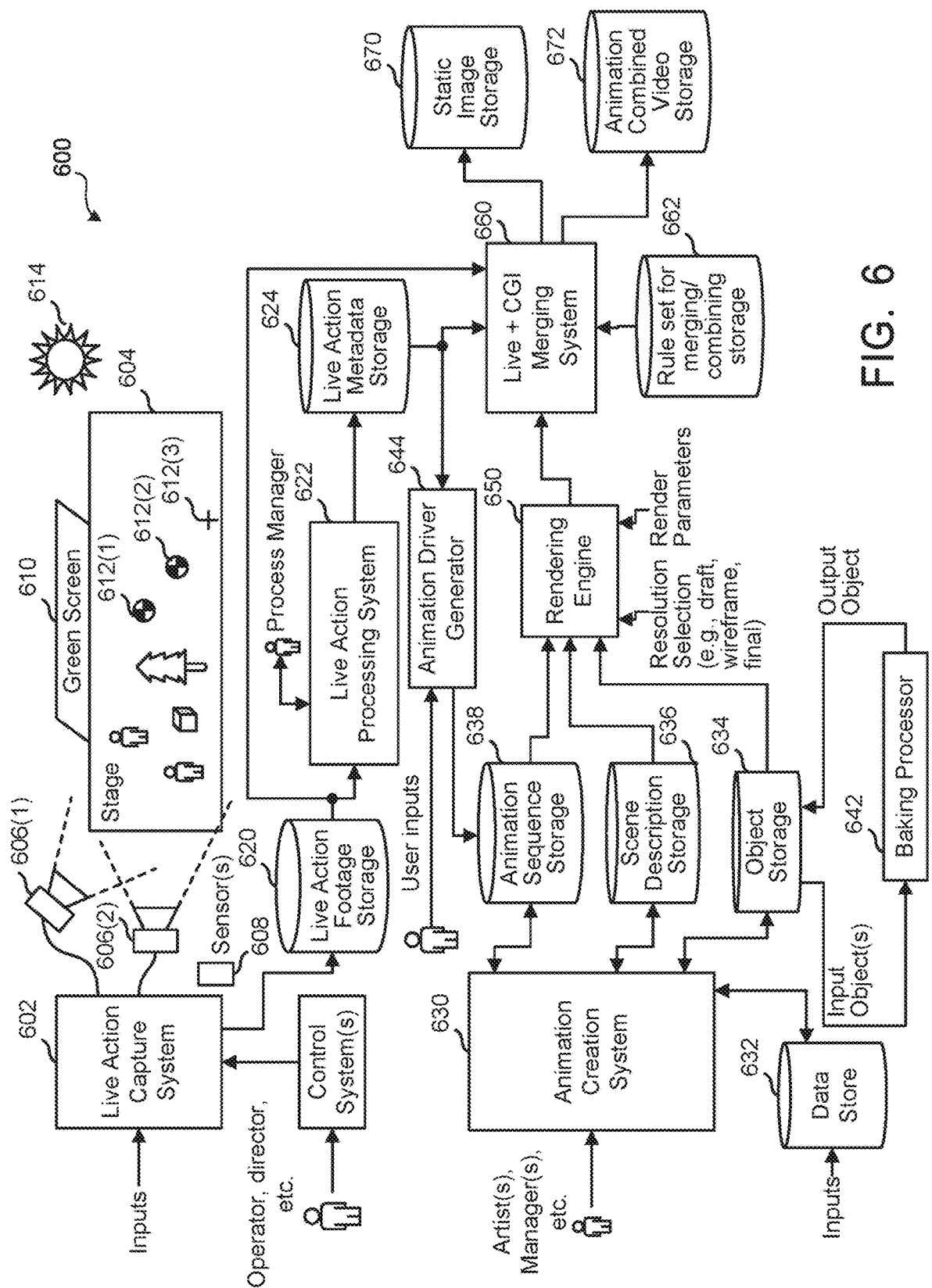
FIG. 6 illustrates an example visual content generation system as might be used to generate imagery in the form of still images and/or video sequences of images.

Rendering components 120 may be one or more other components of visual content generation system 600 depicted in FIG. 6 that are configured to receive the braid data from fiber generator 112, perform any transformations to the data necessary to be provided as input (e.g., as primvars) to a renderer, and provide the transformed data to the renderer to be rendered as a still or animated image data. Rendering may be done from newly provided braids and/or braids from parameters stored to data store 116.

User 122 may be one or more of individuals, computing systems, or other entities having access to provide input to modeler 104. Each user may have a unique name (e.g., username) within the account and may present, or otherwise prove, the possession of security credentials, such as by inputting a password, access key, and/or digital signature, to gain access to modeler 104. In embodiments, user 122 is a digital animation artist that is providing input by which a braid may be procedurally generated in accordance with the techniques of the present disclosure.

Client device 124, in some embodiments, is embodied as a physical device and may be able to send and/or receive input, requests, messages, or other information over an appropriate network. Examples of such devices include personal computers, cellular telephones, handheld messaging devices, laptop computers, tablet computing devices, set-top boxes, personal data assistants, embedded computer systems, electronic book readers, and the like, such as computer system 500 illustrated in FIG. 5. Components used for such a device can depend at least in part upon the type of network and/or environment selected. Protocols and components for communicating via such a network are well known and will not be discussed in detail. Communication over the network can be enabled by wired or wireless connections and combinations thereof.

FIGS. 2A-2D illustrate stages of procedural braid creation of an embodiment of the present disclosure. Specifically, FIG. 2A depicts generation of a braid spine 202. Braid spine 202 may be a curve specified by a user, such as user 122 of FIG. 1, to indicate a path for procedurally-generated braid to follow. Braid spine 202 may have various properties, such as a start point and an end point, from which details about the braid may be determined (e.g., where the braid starts and ends). In some embodiments, the braid spine runs through the center of a braid 208. In other implementations, braid 208 may only generally follow the path of braid spine 202.

FIG. 2B depicts generation of a set of strand spines 204A-204C that weave around each other and generally follow braid spine 202. Set of strand spines 204A-204C may be a set of curves that indicate the paths for procedurally generated strands of the braid to follow. Although FIG. 2B depicts three strands, it is contemplated that techniques of the present disclosure may be applied to any number of strands. The quantity of strand spines (e.g., size of the set of strands) may be specified by a user (e.g., specifying the number of strands for the braid via a user interface or application programming interface call). In some embodiments, set of strand spines 204A-204C may be generated such that braid spine 202 is centrally located to set of strand spines 204A-204C. In other implementations, set of strand spines 204A-204C may only generally follow the path of braid spine 202. The paths followed by each of set of strand spines 204A-204C may be functions of one or more characteristics specified by user 122 of FIG. 1, such as the type of weave to be used (e.g., weave algorithm), the number of strand spines, the number of knots, the tightness of the weave, and so on. In some embodiments, set of strand spines 204A-204C are generated by curve creation component 106 of FIG. 1.

FIG. 2C depicts generating a set of tubes 206A-206C for strands of the braid. Set of tubes 206A-206C may be strand tubes that represent an area of space that a strand is to occupy in the braid. In some embodiments, each tube may be computed by starting with a small tube at the location of its respective strand spine and the tube expanded/widened until it makes contact with a surface of another tube, the surface contacts the braid spine, the tube reaches a specified threshold thickness/radius, or some other criteria used for halting expansion of the tube. In some embodiments, a tightness parameter may be specified to indicate how far a tube can continue to be expanded after the tube makes contact with another tube of set of tubes 206A-206C.

In some implementations, each end of braid spine 202 may be associated with a respective radius (that may be specified by user 122 of FIG. 1). For example, the radii of set of tubes 206A-206C at one end of the braid may be greater than the radii of set of tubes 206A-206C at the opposite end of the braid. The difference between the radii at the start of the braid and the radii at the end of the braid may be determined by a tapering parameter in the set of parameters. In some embodiments, set of tubes 206A-206C may be generated by tube generator 114 of FIG. 1. Note that although the tubes in some implementations may be circular tubes, it is also contemplated that the tubes can be wholly or partially elliptic tubes, square or rectangular tubes, wireframes, etc., or some other tube shape in the cross-section.

FIG. 2D depicts braid 208 rendered with flyaway fibers 210. Braid 208 may comprise a set of fibers that have been assigned positions coextensive, proximate, or in overlapping areas to and/or within respective tubes of set of tubes 206A-206C. The number of fibers may be specified by user 122 of FIG. 1. Additionally or alternatively, user 122 may specify a radius of the fibers and the system of the present disclosure may dynamically determine how many fibers of that radius it can place within the volume of the tube.

Each fiber may be assigned a position coextensive, proximate, or in overlapping areas with, or within a tube and the points of each fiber may be computed by interpolating the vertices of the tube. In some embodiments, for each fiber there are two positions that are considered—one position for the strand tube and another position for the flyaway tube. In such embodiments, these two positions can be interpolated, in order to generate pseudo-random flyaway fibers like those shown in FIG. 2D. In some embodiments, a fiber does not necessarily have a constant radius; for example, a fiber may be thicker at one end and thinner at the other. In some embodiments, the number of flyaway fibers may be determined by a parameter, such as flyaway probability, which may be provided to a stochastic scheme for determining flyaway fibers based on a random seed. In other embodiments, flyaway fibers may be determined according to a round-robin selection according to a flyaway probability or according to some other selection scheme.

In some embodiments, each fiber may be associated with an identifier that distinguishes the fiber from other fibers in the tubes. By associating each fiber with a different identifier, specific fibers may be selected and customized (e.g., radius, color, texture, or reflectiveness changed, etc.).

The system may also determine placement of flyaway fibers 210. Flyaway fibers 210 may be determined according to a frequency specified by user 122. For example, user 122 may specify that 1% of the fibers are to be flyaway fibers, and the system may subsequently locate at least a portion of the fibers determined to be flyaway fibers 210 to be external to set of tubes 206A-206C. Flyaway fibers 210 may be fibers that are not wholly contained within (i.e., are partially external to) set of tubes 206A-206C. Flyaway fibers may be associated with a set of flyaway properties (e.g., flyaway probability, flyaway curviness, etc.), which can change characteristics of the flyaway fibers generated.

In some cases, a set of flyaway tubes (not shown) may encompass respective strand tubes and flyaway fibers 210 may be rendered in the space between the strand tubes and the flyaway tubes. In some embodiments, the fibers within the tubes and flyaway fibers 210 may be determined by fiber generator 112 of FIG. 1. In some embodiments the flyaway tubes may be generated in a similar manner as the generation of the set of strand tubes but may rely on different criteria (e.g., flyaway tube thickness/radius) to determine when to halt expansion of the flyaway tubes.

Using a computer image generation system that provides for procedural braid generation, a creator can specify desired details of the braids and a computer processor can procedurally generate the underlying objects in a scene corresponding to the braids, allowing the creator to more quickly specify desired braids. For example, the creator might specify a central curve for a braid to follow and some parameters and the computer processor can compute a tube structure for the braid from the central curve and the parameters.

A tube might be represented as a long, hollow, cylindrical, bendable structure that represents the space that a strand occupies. The computer processor can then compute the individual fibers and flyaway fibers (fibers that diverge from the braid) that make up each strand. A strand, or partition or section, might represent a set of one or more fibers to be woven/interlaced into a braid. A strand, for example, may be a single length of rope or thread, or, as another example, may be a gathered section of hundreds of hairs or other fibers.

Braids, or plaits, might comprise three or more interlaced strands. A procedurally generated braid can then follow a central curve that runs through the center of the strands. Typically, individual fibers are virtual objects that have a length multiple times longer than a width and can be woven or interlaced into a braid.

A hull, an approximation of an outer surface of a bunch of accumulated surfaces (e.g., the surfaces of the tubes), might comprise a surface of a braid as a whole of the accumulated surfaces of the strands. In some cases, hairs that are more than some distance from the hull are deemed to lack visibility and might be ignored.

A braid spine could be a centerline, but doesn't have to be. A braid spine path may be specified by the artist and a braid constructed to generally follow the braid spine. Likewise, a strand spine could be a centerline, but doesn't have to be. Generally, strands follow strand lines.

From a braid spine and a set of procedurally generated or artist-specified parameters (e.g., default radius, tightness, number of strands), and a specified braiding pattern, a braid generating system generates the strand spines and computes tube positions and sizes that run along the strand spines without intersecting other tubes. A braid generator can adjust the tubes (widening their diameters) until they start to intersect or their maximum radius is reached. A tightness parameter might indicate how wide the tubes might be and where they begin to intersect other tubes indicates how far a tube can expand after it makes contact with another tube.

In some cases, a radius of a strand or braid might be variable, to allow for narrowing of strands. Thus, a digital artist can design a braid by specifying a set of parameters for the braid, whereupon the system will auto-generate the braid. This has a benefit of only needing to store braid parameters, rather than all of the details of some braid mesh that has been manually created. This also has the benefit of being easily modified. For example, need to change the braid to have five strands instead of four would be a simple parameter change. Similarly, a strand thickness or where the braid falls can easily be changed.

Replacing individual fibers with tubes or hulls may assist in saving on computation and computing resources, as well as reduce computational time. A data structure might model hair that has fibers within hulls that follow a strand and/or braid curve.

Figure 3:
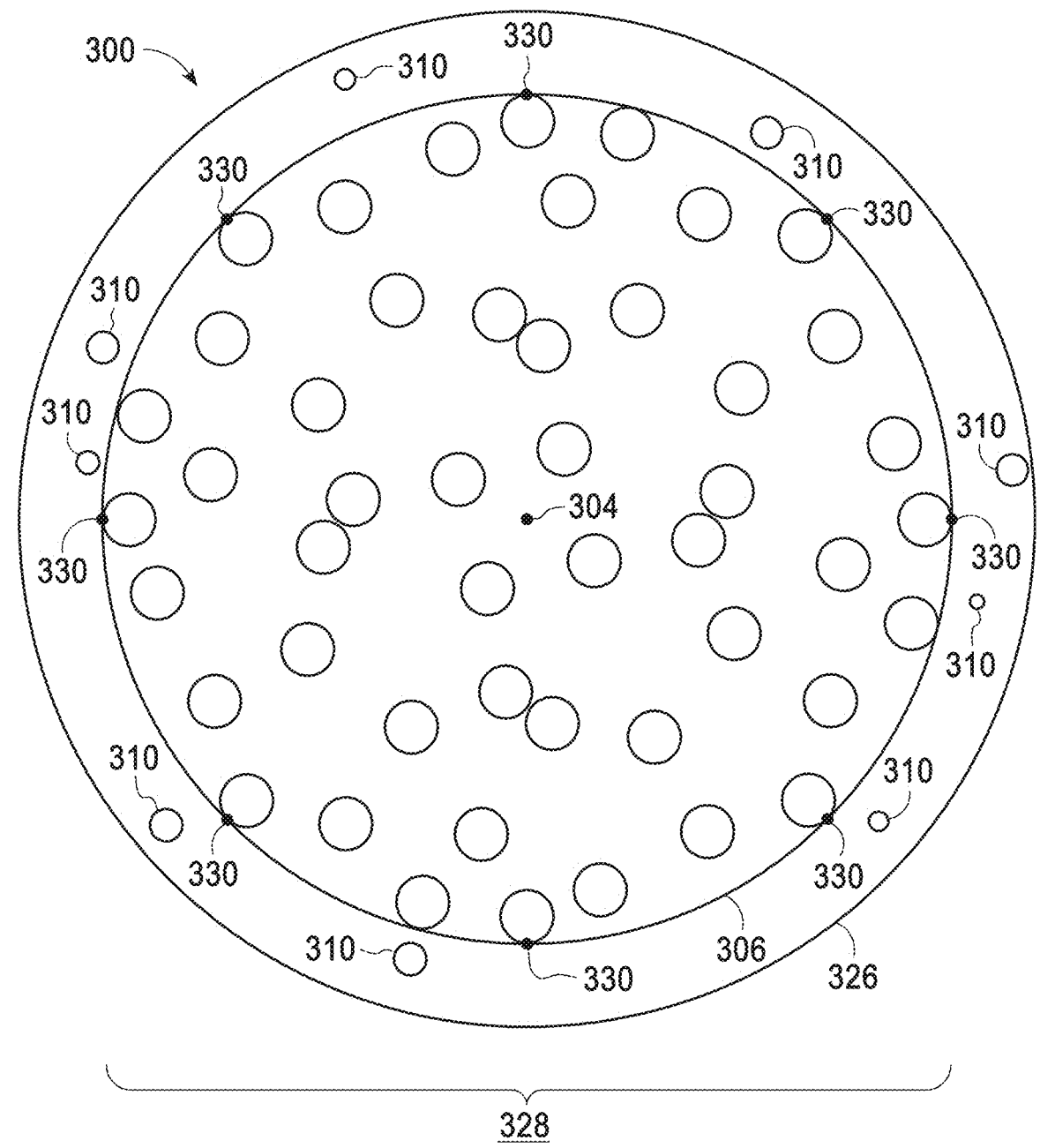
FIG. 3 illustrates a cross-section of a strand of a braid in accordance with an embodiment.

FIG. 3 illustrates a cross-section 300 of a strand of an embodiment of the present disclosure. As illustrated in FIG. 3, cross-section 300 may include a strand tube 306 that comprises a strand of a braid, with a strand spine 304 at its center. Strand tube 306 may be at least partially filled with a set of fibers 328. Strand tube 306 may further be surrounded by a flyaway tube 326, and the space between strand tube 306 and flyaway tube 326 may be at least partially filled with one or more flyaway fibers.

Strand spine 304 may be similar to a member of set of strand spines 204A-204C of FIG. 2B. For example, strand spine 304 may be a central path about which strand tube 306 is to be generated. Strand spine 304 may be generated to generally follow the path of a braid spine (not shown) and interlace between other strand spines (not shown) in the braid.

Strand tube 306 may be similar to a member of the set of tubes 206A-206B of FIG. 2C. Strand tube 306 may be a geometric structure, such as a cylindrical mesh, that represents an area in virtual space that a strand of a braid is to occupy in the virtual space. Strand tube 306 may be used by fiber generator 112 of FIG. 1 as a reference for where fibers are to be placed in the braid (e.g., within strand tube 306 at or near the surface).

Set of fibers 328 may be rendered representations of a long, thin, flexible item (such as a wire, thread, rope, hose, hair, etc.) that can be woven into a braid. In some embodiments, set of fibers 328 are rendered at various (e.g., randomly or according to a placement algorithm) strand tube 306 as depicted in FIG. 3. However, it is also contemplated that embodiments could include rendering set of fibers 328 on the inner or the outer surface of strand tube 306, intersecting the surface of strand tube 306, or filling strand tube 306. In embodiments, each of set of fibers 328 may be assigned a position, referred to in the present disclosure as a "fiber seed" within a 2D cross-section of the braid strand. For example, strand tube 306 may have a starting cross-section and that cross-section may defined by a set of points referred to as hull vertices 330. In embodiments, hull vertices 330 are coplanar and are circularly ordered such that a hull-encircling path through the hull vertices forms a simple closed area. In some embodiments, however, this is not a strict requirement. The initial cross-section may be referred to in the present disclosure as the strand seed cross-section.

The fiber seeds may be expressed as a linear combination of 2D hull vertices 330. The 3D positions of set of fibers 328 may be computed by evaluating this linear combination at each section of the 3D strand hull. For example, each of set of fibers 328 may be computed by interpolating hull vertices 330, using the same interpolation weights at each section of the hull. Since these weights are positive and since each hull section is convex, the resulting fiber should always stay inside the strand. For example, the system of the present disclosure may utilize a generalization of barycentric coordinates called "mean value coordinates," which makes every seed point depend on all (not just three) of the hull vertices. The corresponding weights may all be positive and smooth inside the cross-section polygon, which may ensure that the fibers remain nicely distributed within the strand if the hull is locally deformed (e.g., if the hull collides against another strand hull).

The volume comprising strand tube 306 may be defined by the movement of cross-sections through the scene space from the strand seed cross-section, which may be defined by an angle, a constriction factor, and/or strand spine 304 path. In embodiments, cross-section 300 area need not be fixed, as some strands may be constricted by other strands. The volume of strand tube 306 may be defined by this moving cross-section, which in turn may be defined by hull vertices 330, which started at hull vertices on the strand seed cross-section and move through the scene space to a set of end vertices.

The path of a given fiber (e.g., hair, etc.) may not be expressed as a parameterized curve in the scene space, but may be expressed as a linear combination of hull vertices 330, so that at each cross-section of the strand, the intersection of that fiber and the hull cross-section is computed and may be constant as strand tube 306 itself moves around. In some embodiments, a particular fiber may be specified as a flyaway, in which the fiber may be released from its fixed linear combination so that it can take on a line combination value that places it outside of the hull cross-section. In embodiments, the flyaway fiber is still a linear combination of the hull cross-section vertices, and so the flyaway fiber will stay nearby as strand tube 306 (and the braid comprising three or more strand tubes) moves around in the scene space. These techniques provide a useful tool that allows artists to more easily specify fiber positions without having to individually place each fiber.

In some embodiments, with enough fibers placed around an inner border of strand tube 306, the inner regions of strand tube 306 can be omit some fibers, as those inner regions aren't visible, thereby saving computation time. In other embodiments, set of fibers 328 is distributed (e.g., randomly or according to a placement algorithm) throughout strand tube 306, not just the outer regions in cases where the fibers are very thin and/or not fully opaque so that the outer strands do not completely occlude the inner strands such that removing these inner strands could have a noticeable effect on light transport (especially in backlight configurations). The generation of set of fibers 328 by interpolation of hull vertices 330 may not very expensive in terms of computing resources because only a few vertices may be needed for the cross-section polygons. In some cases, only the strand hulls may be displayed instead of the fibers in order to save memory/computation time.

Note that after this procedure, some fibers may exit the strand during the generation of one or more of flyaway fibers 310. One or more of flyaway fibers 310 may be a similar to flyaway fibers 210 of FIG. 2D. One or more of flyaway fibers 310 may be fibers generated to appear to have strayed from strand tube 306 so as to give the strand a more realistic appearance. The one or more flyaway fibers may be located within a space between the outer surface of strand tube 306 and the inner surface of flyaway tube 326. The number of flyaway fibers may be affected by a user preference (e.g., frequency value). In embodiments, flyaway fibers 310 are generated in two stages. In a first stage, flyaway fiber positions may be obtained by computing "flyaway fibers" using the same seeds as the original set of fibers 328, but with a dilated version of the strand hulls. The flyaway positions may then be blended with the original positions at random intervals along the fiber. In the second stage, the outer fibers may be split at random positions to generate new flyaway fiber tips. In the vicinity of a flyaway fiber tip, the fiber may be bent away from the braid curve by a random amount.

Flyaway tube 326 may be an outer tube within which one or more of flyaway fibers 310 are rendered. Flyaway tube 326 may be a geometric structure surrounding strand tube 306, and the space between the surfaces of flyaway tube 326 and strand tube 306 may define where one or more of flyaway fibers 310 are to be located. The radius of flyaway tube 326, which is larger in diameter than strand tube 306, may be used in combination with the radius of strand tube 306 to set the position of seed vertices of one or more of flyaway fibers 310 inside flyaway tube 326 at each cross-section; e.g., somewhere between the outside surface of strand tube 306 and the inside surface of flyaway tube 326 once the flyaway fiber extends through the strand tube 326.

Figure 4:
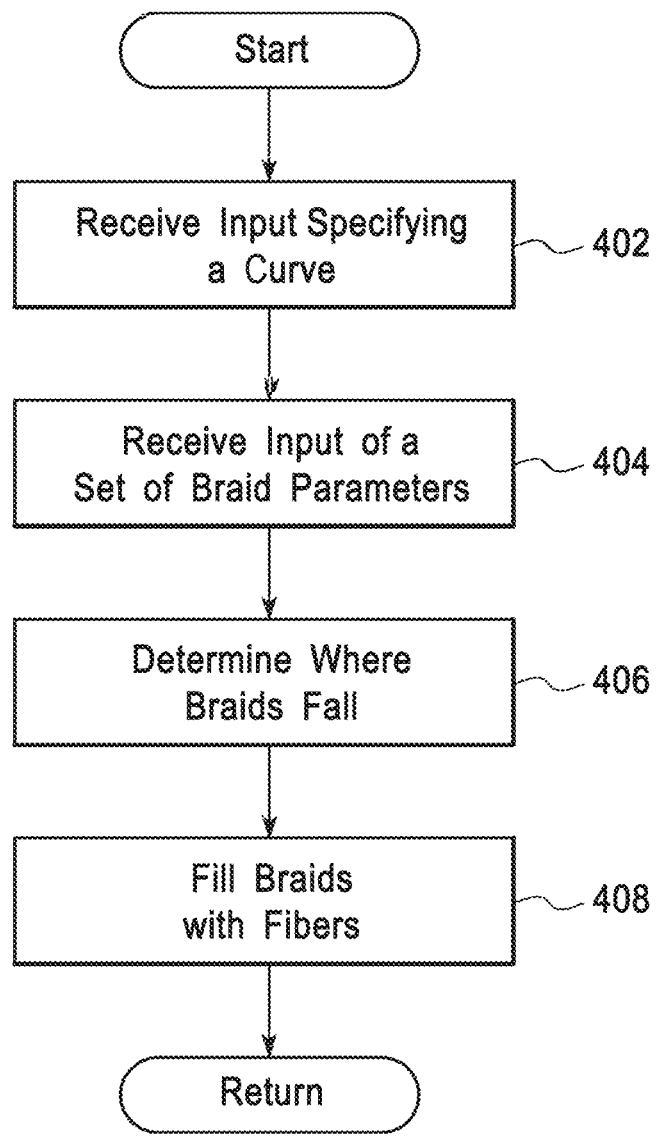
FIG. 4 illustrates a flowchart that illustrates an example of procedurally generating a braid in accordance with an embodiment.

FIG. 4 is a flowchart illustrating an example of a process 400 for procedural generation of braids in accordance with various embodiments. Some or all of process 400 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer program persistently stored on magnetic, optical, or flash media).

For example, some or all of process 400 may be performed by any suitable system, such as by an application server, by multiple computing devices in a distributed system of a computing resource service provider, or by any electronic computing device such as computer system 500 of FIG. 5, which may be a member of an animation creation system, such as an animation creation system 630 component of the of visual content generation system 600 depicted in FIG. 6. Process 400 includes a series of operations wherein the system procedurally generates a braid by receiving input (e.g., from user 122 via client device 124 of FIG. 1) that specifies a curve of a braid, receiving (e.g., from user 122) a set of parameters for generating the braid, determining the location of the braid and the size and positions of tubes, and filling the tubes with fibers.

In step 402, the system performing the process may receive input specifying a direction, such as a curve for the braid (e.g., braid spine 202 of FIG. 2A). The system may receive the input from a device, such as client device 124 (e.g., at modeler 104), or from a data store such as data store 116 of FIG. 1. The input may specify, for example, a start point for the curve, an end point for the curve, and/or a path of the curve.

In step 404, the system performing the process may obtain a set of braid parameters. The system may receive the set of braid parameters via client device 124, from data store 116, or from some other source. The set of braid parameters may include parameters for braid layout and/or braid properties. Thus, to generate a braid, the braid generation computing system might receive a set of parameters (e.g., a curve/center line of the braid indicating where it falls, a curve for a weave of the braid, number of strands, number of fibers in strand, thickness of strands, etc.) from an artist, where braid thickness may be a function of strand thickness or vice versa.

Parameters for braid layout may include, but not be limited to, one or more of a number of strands for the braid, a knot size for the braid, a knot heterogeneity, a braid radius and/or thickness, a strand radius and/or thickness (if not already determined by the braid radius/thickness and number of strands per braid and/or hairs per strand parameters and hair thicknesses), strand heterogeneity frequency, and/or strand heterogeneity range. Knots might be features at the ends of a braid or at other places in the braid. In some illustrations or construction of braids, the fibers are constrained within a knot structure to be touching tightly, e.g., in a tight knot, or touching loosely. In some implementations, knots of fibers are allowed to move around and knots might come undone.

The braid properties may include, but not be limited to, one or more of a number of samples, a number of radial divisions, a random seed, a tapering value, a frequency scaling value, a strand smoothness property, a flyaway loop offset, a number of fibers within a strand, a flyaway loop probability, a flyaway loop variance, a flyaway tip probability, a flyaway tip variance, a flyaway tip length, a flyaway tip clustering value, a flyaway tip cluster skip ration value, and/or a flyaway tip number of clusters.

In step 406, the system performing the process may utilize the curve of step 402 and the set of braid parameters of step 404 to procedurally determine where the strands of the braid and the braid as a whole fall and generate the tubes of the braid (see FIGS. 2A-2C). The system may generate, based on the set of parameters previously provided, the individual strand spines for each strand of the set of strands, where the strand spines generated to interlace with one another while generally following the path of the braid spine. This then allows for procedural determination of the strands. To procedurally compute tubes for the strand spines, the system might generate the tubes by expanding a tube at the strand spine until it reaches a specified radius/thickness or until it hits the surface of another tube, whichever comes first to ensure that the strands do not intersect/overlap.

In step 408, the system performing the process may assign fibers within each of the tubes of step 406 in accordance with the set of parameters of step 204 (see braid 208 of FIG. 2D). Flyaway fibers might be pseudo-randomly generated according to a specified parameter. Generating flyaway fibers might comprise generating a thicker tube around the strand tube, and rendering the thicker tube to display fly away fibers.

In some embodiments, the system may further determine and generate flyaway fibers for the braid (see flyaway fibers 210 of FIG. 2D). The system performing the process 400 may output the data generated to define the braid in steps 402-408 to a renderer (e.g., see FIG. 1) or may store the data in a data store to be rendered later (e.g., in object storage 634 of FIG. 6).

Note that one or more of the operations performed in steps 402-408 may be performed in various orders and combinations, including in parallel. For example, not all implementations may utilize flyaway fibers, and consequently such implementations may omit the flyaway portion of step 408.

As one skilled in the art will appreciate in light of this disclosure, certain embodiments may be capable of achieving certain advantages, including some or all of the following: (1) Techniques described and suggested in the present disclosure improve the field of computing, especially the field of digital animation, by replacing individual fibers in simulated braids, computational resources needed to generate and render the braids are conserved. (2) Additionally, techniques described and suggested in the present disclosure improve the efficiency of computing systems by, since the braids can be generated on the fly from a stored set of parameters instead of as a polygon mesh of edges and vertices, the braid data can be stored more compactly and loaded into memory more efficiently.

(3) Furthermore, techniques described and suggested in the present disclosure improve the user (e.g., the digital artist/animator) because the braid can be easily modified by making changes to one or more of the set of parameters. (4) Moreover, techniques described and suggested in the present disclosure are necessarily rooted in computer technology in order to overcome problems specifically arising with how to generate braids procedurally.

According to one embodiment, the techniques described herein are implemented by one or generalized computing systems programmed to perform the techniques pursuant to program instructions in firmware, memory, other storage, or a combination. Special-purpose computing devices may be used, such as desktop computer systems, portable computer systems, handheld devices, networking devices or any other device that incorporates hard-wired and/or program logic to implement the techniques.

For example, FIG. 5 is a block diagram that illustrates a computer system 500 upon which the computer systems of system 100 (see FIG. 1) and/or visual content generation system 600 (see FIG. 6) may be implemented. Computer system 500 includes a bus 502 or other communication mechanism for communicating information, and a processor 504 coupled with bus 502 for processing information. Processor 504 may be, for example, a general purpose microprocessor.

Computer system 500 also includes a main memory 506, such as a random access memory (RAM) or other dynamic storage device, coupled to bus 502 for storing information and instructions to be executed by processor 504. Main memory 506 may also be used for storing temporary variables or other intermediate information during execution of instructions to be executed by processor 504. Such instructions, when stored in non-transitory storage media accessible to processor 504, render computer system 500 into a special-purpose machine that is customized to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a computer monitor, for displaying information to a computer user. An input device 514, including alphanumeric and other keys, is coupled to bus 502 for communicating information and command selections to processor 504. Another type of user input device is a cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may include non-volatile media and/or volatile media. Non-volatile media includes, for example, optical or magnetic disks, such as storage device 510. Volatile media includes dynamic memory, such as main memory 506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, an EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire, and fiber optics, including the wires that include bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a network connection. A modem or network interface local to computer system 500 can receive the data. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. Wireless links may also be implemented. In any such implementation, communication interface 518 sends and receives electrical, electromagnetic, or optical signals that carry digital data streams representing various types of information.

Network link 520 typically provides data communication through one or more networks to other data devices. For example, network link 520 may provide a connection through a local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic, or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520, and communication interface 518. In the Internet example, a server 530 might transmit a requested code for an application program through Internet 528, ISP 526, local network 522, and communication interface 518. The received code may be executed by processor 504 as it is received, and/or stored in storage device 510, or other non-volatile storage for later execution.

For example, FIG. 6 illustrates the example of visual content generation system 600 as might be used to generate imagery in the form of still images and/or video sequences of images. Visual content generation system 600 might generate imagery of live action scenes, computer generated scenes, or a combination thereof. In a practical system, users are provided with tools that allow them to specify, at high levels and low levels where necessary, what is to go into that imagery. For example, a user might be an animation artist and might use visual content generation system 600 to capture interaction between two human actors performing live on a sound stage and replace one of the human actors with a computer-generated anthropomorphic non-human being that behaves in ways that mimic the replaced human actor's movements and mannerisms, and then add in a third computer-generated character and background scene elements that are computer-generated, all in order to tell a desired story or generate desired imagery.

Still images that are output by visual content generation system 600 might be represented in computer memory as pixel arrays, such as a two-dimensional array of pixel color values, each associated with a pixel having a position in a two-dimensional image array. Pixel color values might be represented by three or more (or fewer) color values per pixel, such as a red value, a green value, and a blue value (e.g., in RGB format). Dimension of such a two-dimensional array of pixel color values might correspond to a preferred and/or standard display scheme, such as 1920 pixel columns by 1280 pixel rows. Images might or might not be stored in a compressed format, but either way, a desired image may be represented as a two-dimensional array of pixel color values. In another variation, images are represented by a pair of stereo images for three-dimensional presentations and in other variations, some or all of an image output might represent three-dimensional imagery instead of just two-dimensional views.

A stored video sequence might include a plurality of images such as the still images described above, but where each image of the plurality of images has a place in a timing sequence and the stored video sequence is arranged so that when each image is displayed in order, at a time indicated by the timing sequence, the display presents what appears to be moving and/or changing imagery. In one representation, each image of the plurality of images is a video frame having a specified frame number that corresponds to an amount of time that would elapse from when a video sequence begins playing until that specified frame is displayed. A frame rate might be used to describe how many frames of the stored video sequence are displayed per unit time. Example video sequences might include 24 frames per second (24 FPS), 50 FPS, 140 FPS, or other frame rates. In some embodiments, frames are interlaced or otherwise presented for display, but for the purpose of clarity of description, in some examples, it is assumed that a video frame has one specified display time and it should be understood that other variations are possible.

One method of creating a video sequence is to simply use a video camera to record a live action scene, i.e., events that physically occur and can be recorded by a video camera. The events being recorded can be events to be interpreted as viewed (such as seeing two human actors talk to each other) and/or can include events to be interpreted differently due to clever camera operations (such as moving actors about a stage to make one appear larger than the other despite the actors actually being of similar build, or using miniature objects with other miniature objects so as to be interpreted as a scene containing life-sized objects).

Creating video sequences for story-telling or other purposes often calls for scenes that cannot be created with live actors, such as a talking tree, an anthropomorphic object, space battles, and the like. Such video sequences might be generated computationally rather than capturing light from live scenes. In some instances, an entirety of a video sequence might be generated computationally, as in the case of a computer-animated feature film. In some video sequences, it is desirable to have some computer-generated imagery and some live action, perhaps with some careful merging of the two.

While computer-generated imagery might be creatable by manually specifying each color value for each pixel in each frame, this is likely too tedious to be practical. As a result, a creator uses various tools to specify the imagery at a higher level. As an example, an artist might specify the positions in a scene space, such as a three-dimensional coordinate system, of objects and/or lighting, as well as a camera viewpoint, and a camera view plane. Taking all of that as inputs, a rendering engine may compute each of the pixel values in each of the frames. In another example, an artist specifies position and movement of an articulated object having some specified texture rather than specifying the color of each pixel representing that articulated object in each frame.

In a specific example, a rendering engine performs ray tracing wherein a pixel color value is determined by computing which objects lie along a ray traced in the scene space from the camera viewpoint through a point or portion of the camera view plane that corresponds to that pixel. For example, a camera view plane might be represented as a rectangle having a position in the scene space that is divided into a grid corresponding to the pixels of the ultimate image to be generated, and if a ray defined by the camera viewpoint in the scene space and a given pixel in that grid first intersects a solid, opaque, blue object, that given pixel is assigned the color blue. Of course, for modern computer-generated imagery, determining pixel colors—and thereby generating imagery—can be more complicated, as there are lighting issues, reflections, interpolations, and other considerations.

As illustrated in FIG. 6, a live action capture system 602 captures a live scene that plays out on a stage 604. Live action capture system 602 is described herein in greater detail, but might include computer processing capabilities, image processing capabilities, one or more processors, program code storage for storing program instructions executable by the one or more processors, as well as user input devices and user output devices, not all of which are shown.

In a specific live action capture system, cameras 606(1) and 606(2) capture the scene, while in some systems, there might be other sensor(s) 608 that capture information from the live scene (e.g., infrared cameras, infrared sensors, motion capture ("mo-cap") detectors, etc.). On stage 604, there might be human actors, animal actors, inanimate objects, background objects, and possibly an object such as a green screen 610 that is designed to be captured in a live scene recording in such a way that it is easily overlaid with computer-generated imagery. Stage 604 might also contain objects that serve as fiducials, such as fiducials 612(1)-(3), that might be used post-capture to determine where an object was during capture. A live action scene might be illuminated by one or more lights, such as an overhead light 614.

During or following the capture of a live action scene, live action capture system 602 might output live action footage to a live action footage storage 620. A live action processing system 622 might process live action footage to generate data about that live action footage and store that data into a live action metadata storage 624. Live action processing system 622 might include computer processing capabilities, image processing capabilities, one or more processors, program code storage for storing program instructions executable by the one or more processors, as well as user input devices and user output devices, not all of which are shown. Live action processing system 622 might process live action footage to determine boundaries of objects in a frame or multiple frames, determine locations of objects in a live action scene, where a camera was relative to some action, distances between moving objects and fiducials, etc. Where elements are sensored or detected, the metadata might include location, color, and intensity of overhead light 614, as that might be useful in post-processing to match computer-generated lighting on objects that are computer-generated and overlaid on the live action footage. Live action processing system 622 might operate autonomously, perhaps based on predetermined program instructions, to generate and output the live action metadata upon receiving and inputting the live action footage. The live action footage can be camera-captured data as well as data from other sensors.

An animation creation system 630 is another part of visual content generation system 600. Animation creation system 630 might include computer processing capabilities, image processing capabilities, one or more processors, program code storage for storing program instructions executable by the one or more processors, as well as user input devices and user output devices, not all of which are shown. Animation creation system 630 might be used by animation artists, managers, and others to specify details, perhaps programmatically and/or interactively, of imagery to be generated. From user input and data from a database or other data source, indicated as a data store 632, animation creation system 630 might generate and output data representing objects (e.g., a horse, a human, a ball, a teapot, a cloud, a light source, a texture, etc.) to an object storage 634, generate and output data representing a scene into a scene description storage 636, and/or generate and output data representing animation sequences to an animation sequence storage 638.

Scene data might indicate locations of objects and other visual elements, values of their parameters, lighting, camera location, camera view plane, and other details that a rendering engine 650 might use to render CGI imagery. For example, scene data might include the locations of several articulated characters, background objects, lighting, etc. specified in a two-dimensional space, three-dimensional space, or other dimensional space (such as a 2.5-dimensional space, three-quarter dimensions, pseudo-3D spaces, etc.) along with locations of a camera viewpoint and view place from which to render imagery. For example, scene data might indicate that there is to be a red, fuzzy, talking dog in the right half of a video and a stationary tree in the left half of the video, all illuminated by a bright point light source that is above and behind the camera viewpoint. In some cases, the camera viewpoint is not explicit, but can be determined from a viewing frustum. In the case of imagery that is to be rendered to a rectangular view, the frustum would be a truncated pyramid. Other shapes for a rendered view are possible and the camera view plane could be different for different shapes.

Animation creation system 630 might be interactive, allowing a user to read in animation sequences, scene descriptions, object details, etc. and edit those, possibly returning them to storage to update or replace existing data. As an example, an operator might read in objects from object storage into a baking processor that would transform those objects into simpler forms and return those to object storage 634 as new or different objects. For example, an operator might read in an object that has dozens of specified parameters (movable joints, color options, textures, etc.), select some values for those parameters and then save a baked object that is a simplified object with now fixed values for those parameters.

Rather than have to specify each detail of a scene, data from data store 632 might be used to drive object presentation. For example, if an artist is creating an animation of a spaceship passing over the surface of the Earth, instead of manually drawing or specifying a coastline, the artist might specify that animation creation system 630 is to read data from data store 632 in a file containing coordinates of Earth coastlines and generate background elements of a scene using that coastline data.

Animation sequence data might be in the form of time series of data for control points of an object that has attributes that are controllable. For example, an object might be a humanoid character with limbs and joints that are movable in manners similar to typical human movements. An artist can specify an animation sequence at a high level, such as "the left hand moves from location (X1, Y1, Z1) to (X2, Y2, Z2) over time T1 to T2", at a lower level (e.g., "move the elbow joint 2.5 degrees per frame") or even at a very high level (e.g., "character A should move, consistent with the laws of physics that are given for this scene, from point P1 to point P2 along a specified path").

Animation sequences in an animated scene might be specified by what happens in a live action scene. An animation driver generator 644 might read in live action metadata, such as data representing movements and positions of body parts of a live actor during a live action scene, and generate corresponding animation parameters to be stored in animation sequence storage 638 for use in animating a CGI object. This can be useful where a live action scene of a human actor is captured while wearing mo-cap fiducials (e.g., high-contrast markers outside actor clothing, high-visibility paint on actor skin, face, etc.) and the movement of those fiducials is determined by live action processing system 622. Animation driver generator 644 might convert that movement data into specifications of how joints of an articulated CGI character are to move over time.

A rendering engine 650 can read in animation sequences, scene descriptions, and object details, as well as rendering engine control inputs, such as a resolution selection and a set of rendering parameters. Resolution selection might be useful for an operator to control a trade-off between speed of rendering and clarity of detail, as speed might be more important than clarity for a movie maker to test a particular interaction or direction, while clarity might be more important that speed for a movie maker to generate data that will be used for final prints of feature films to be distributed. Rendering engine 650 might include computer processing capabilities, image processing capabilities, one or more processors, program code storage for storing program instructions executable by the one or more processors, as well as user input devices and user output devices, not all of which are shown.

Visual content generation system 600 can also include a merging system 660 that merges live footage with animated content. The live footage might be obtained and input by reading from live action footage storage 620 to obtain live action footage, by reading from live action metadata storage 624 to obtain details such as presumed segmentation in captured images segmenting objects in a live action scene from their background (perhaps aided by the fact that green screen 610 was part of the live action scene), and by obtaining CGI imagery from rendering engine 650.

A merging system 660 might also read data from rulesets for merging/combining storage 662. A very simple example of a rule in a ruleset might be "obtain a full image including a two-dimensional pixel array from live footage, obtain a full image including a two-dimensional pixel array from rendering engine 650, and output an image where each pixel is a corresponding pixel from rendering engine 650 when the corresponding pixel in the live footage is a specific color of green, otherwise output a pixel value from the corresponding pixel in the live footage."

Merging system 660 might include computer processing capabilities, image processing capabilities, one or more processors, program code storage for storing program instructions executable by the one or more processors, as well as user input devices and user output devices, not all of which are shown. Merging system 660 might operate autonomously, following programming instructions, or might have a user interface or programmatic interface over which an operator can control a merging process. In some embodiments, an operator can specify parameter values to use in a merging process and/or might specify specific tweaks to be made to an output of merging system 660, such as modifying boundaries of segmented objects, inserting blurs to smooth out imperfections, or adding other effects. Based on its inputs, merging system 660 can output an image to be stored in a static image storage 670 and/or a sequence of images in the form of video to be stored in an animated/combined video storage 672.

Thus, as described, visual content generation system 600 can be used to generate video that combines live action with computer-generated animation using various components and tools, some of which are described in more detail herein. While visual content generation system 600 might be useful for such combinations, with suitable settings, it can be used for outputting entirely live action footage or entirely CGI sequences. The code may also be provided and/or carried by a transitory computer readable medium, e.g., a transmission medium such as in the form of a signal transmitted over a network.

Figure 7:
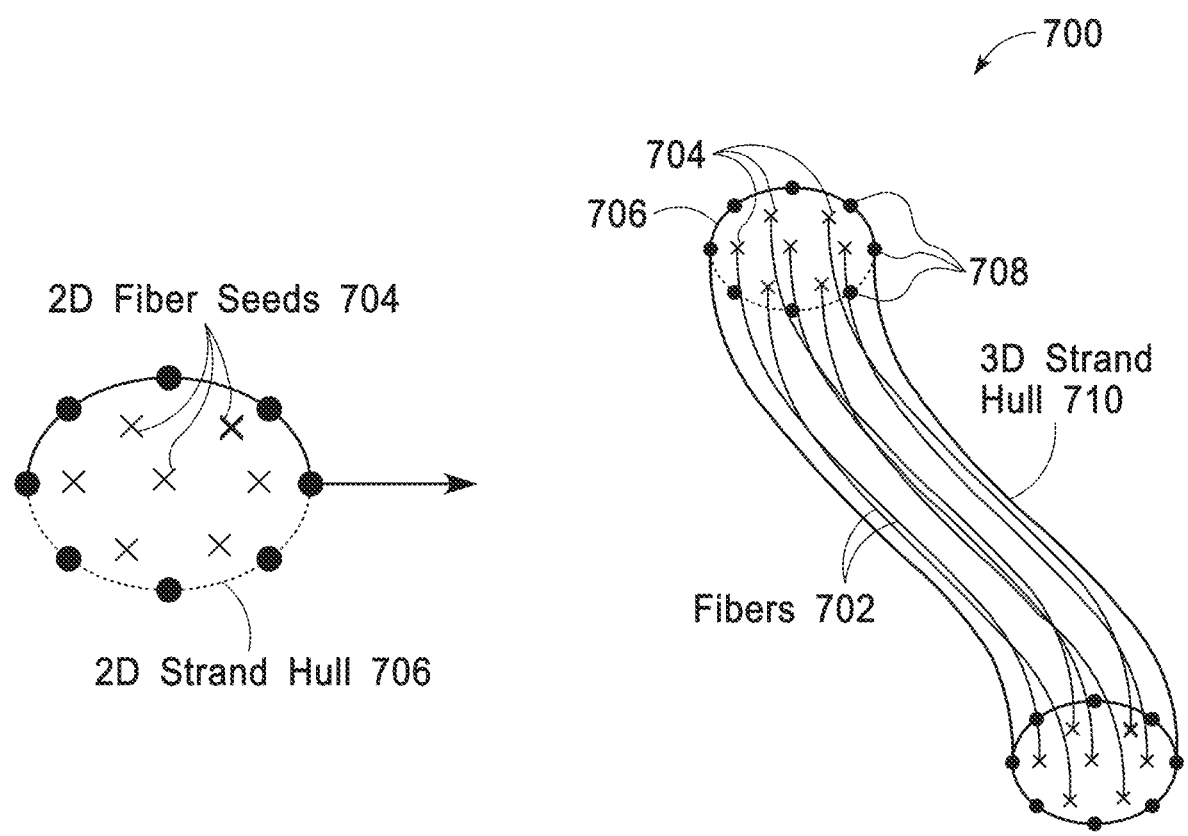
FIG. 7 illustrates a cross-section and hull view of a strand having fibers in accordance with an embodiment.

FIG. 7 illustrates a cross-section and hull view 700 of a strand having fibers in accordance with an embodiment. As illustrated in cross-section and hull view 700, each of fibers 702 might be assigned a 2D position or seed shown as 2D fiber seeds 704 within the cross-section of the braid strand shown as the right cross-section in FIG. 7. 2D fiber seeds 704 might be expressed as a linear combination of vertices 708 of 2D hull 706. The system computes the 3D positions of fibers 702 (e.g., corresponding to 2D fiber seeds 704) by evaluating this linear combination at each section of 3D strand hull 712. Each of fibers 702 may be computed by interpolating vertices 708 of 2D strand hull 706 and corresponding 3D strand hull 710, using the same interpolation weights at each section of 2D strand hull 706. Since these weights are positive and since each hull section is convex, resulting fibers 702 are always staying inside their strand, as in FIG. 7. Some of fibers 702 may come out of their strand during the generation of flyaways. The generation of fibers 702 by interpolation of vertices 708 may not be expensive computationally as the processor may not need to use many vertices for the cross-section polygons (typical models might use only 16 vertices/cross-section). On background characters, just the strand hulls might be used instead of fibers 702 in order to save memory/computation time.

The outer hull for flyaway strands might not be an independently specified hull, but be a dependent function of the inner hull, such as 2D strand hull 706 and 3D strand hull 710. For example, the outer hull might be the same shape as the inner hull and has the same center, but is X % bigger. The radius of the flyaway hull, the outer hull, which is larger in diameter than the inner hull (e.g., 2D strand hull 706 and 3D strand hull 710), can be used in combination with the radius of the inner hull to set the position of the seed vertices of the flyaway fibers inside the flyaway hull at each cross-section, somewhere between the outside of the inner hull and the inside surface of the flyaway hull, once the flyaway fiber extends through the inner hull.

For a model generation process, or other computational process, to construct fibers 702, i.e., determining their paths, each fiber might have a starting position, or seed position. The strand has a starting cross-section and that cross-section is defined by a set of points, the "hull seed vertices" That may correspond to vertices 708 in FIG. 7. These hull seed vertices might be coplanar and circularly ordered such that a hull-encircling path through them forms a simple closed area, "a strand seed cross-section." That might not be a strict requirement. The volume swept out by a strand may be defined by the movement of cross-section through the scene space from the strand seed cross-section, which might be defined by some angle, some constriction factors, and a strand spine (a central strand path). The cross-section area need not be fixed, as some strands may be constricted by other strands. The volume of the braid strand might be defined by this moving cross-section, which is in turn defined by the hull vertices, which started at the hull seed vertices and moved through the scene space to some end vertices.

The path of a given fiber of fibers 702 (hair, etc.) may not be expressed as a parameterized curve in the scene space, but may be expressed as a linear combination of vertices 708, so that at each cross-section of the strand, the intersection of that fiber and the hull cross-section is computed and may be constant as the strand itself moves around. Other methods are possible. This is a useful tool, perhaps as part of an animation creation system, to allow for artists to more easily specify fiber positions without having to individually place each fiber.

Figure 8:
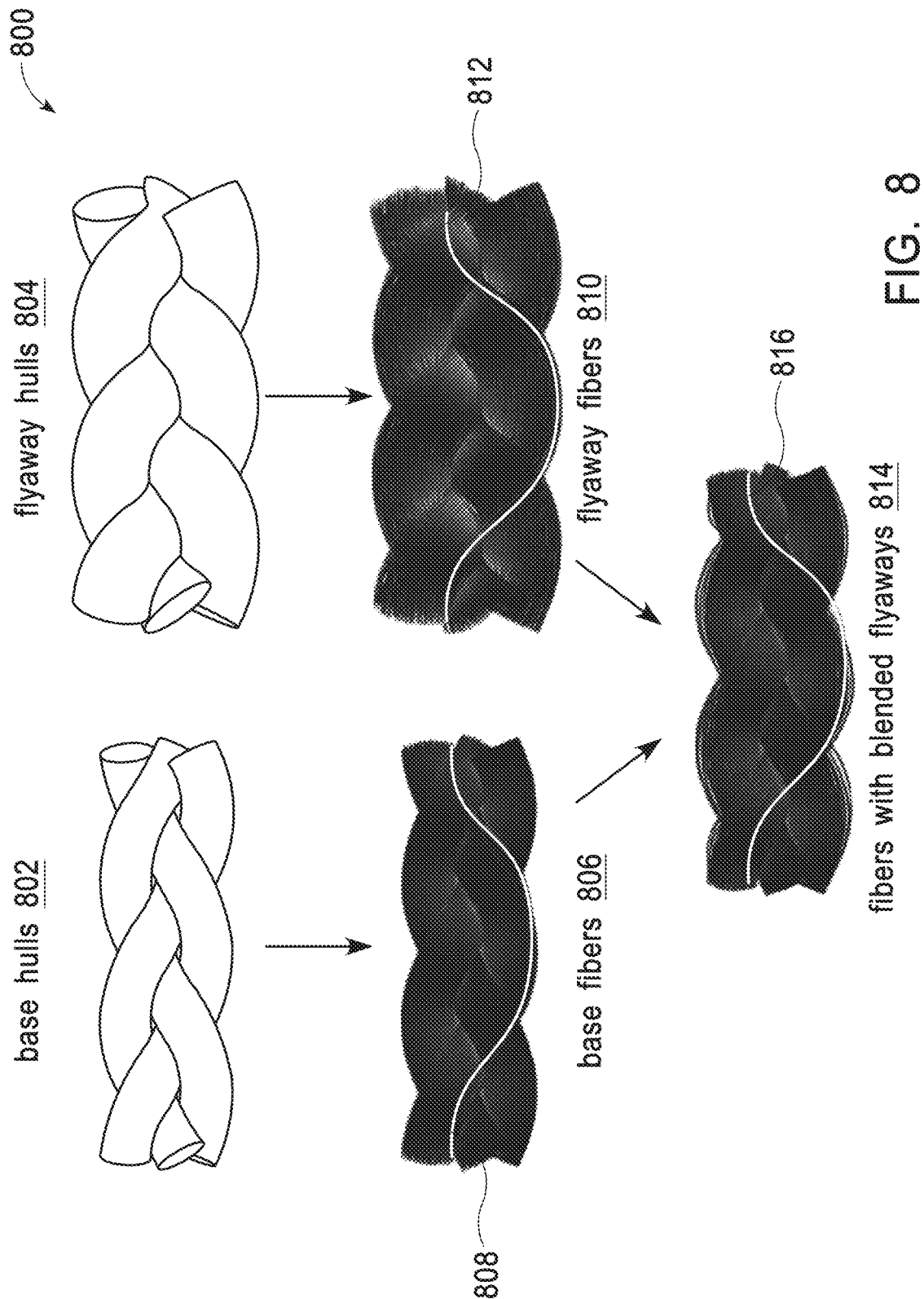
FIG. 8 illustrates base hulls and flyaway hulls used to generate braided strands of fibers in accordance with an embodiment.

FIG. 8 illustrates base hulls and flyaway hulls 800 used to generate braided strands of fibers in accordance with an embodiment. FIG. 8 illustrates an aspect of an embodiment showing how a braided strand of fibers with flyaway fibers might be generated by combining stages from base hulls and flyaway hulls 800. In a first stage, flyaway positions are obtained by computing "flyaway fibers" using the same seeds as the original fibers, but with a dilated version of the strand hulls. For example, base hulls 802 are shown having the hulls for the initial strands of the braid. Base hulls 802 for the strands may be generated using an initial braid spine, then further interlacing, intertwining, or otherwise generating strand spines flowing the braid spine and within a tolerance from the braid spine. Strands for base hulls 802 correspond to geometric structures, which may be a tessellated mesh, that encircle or encapsulate the stand spines. From base hulls 802, flyaway hulls 804 may be generated by creating an outer diameter of a further geometric structure for flyaway hulls 804 a certain distance from base hulls 802, such as by expanding a radius of base hulls 802 by a certain amount, percentage, or factor from a centerline or point of base hulls 802 (and flyaway hulls 804). However, base hulls 802 and flyaway hulls 804 may further have different geometric structures.

Thereafter, base fibers 806, such as a base fiber 808 that travels through one of the strands of base hulls 802 are generated for base hulls 802. Base fiber 808 may show an initial representation of the fibers that travel through base hulls 802, which are narrower or constrained than flyways hulls 804. Using flyaway hulls 804, flyaway fibers 810, such as flyaway fiber 812, are generated for flyaway hulls 804. Similar to base fiber 808, flyaway fiber 812 may show an initial representation of the fibers that travel through flyaway hulls 804, which expand to a greater or further area than base hulls 802. The flyaway positions are then blended with the original positions at random intervals along the fiber. These are the blended in order to have fibers with blended flyaways 814. (e.g., one or more flyaway fibers). This then shows a blended fiber 816 that shows the combined approximate distances and/or placements of fibers combined from base fibers 806 and flyaway fibers 810. In FIG. 8, a single fiber is shown with a solid black curve. Thus, the outer fibers are split at random positions to generate new flyaway tips.

Figure 9:
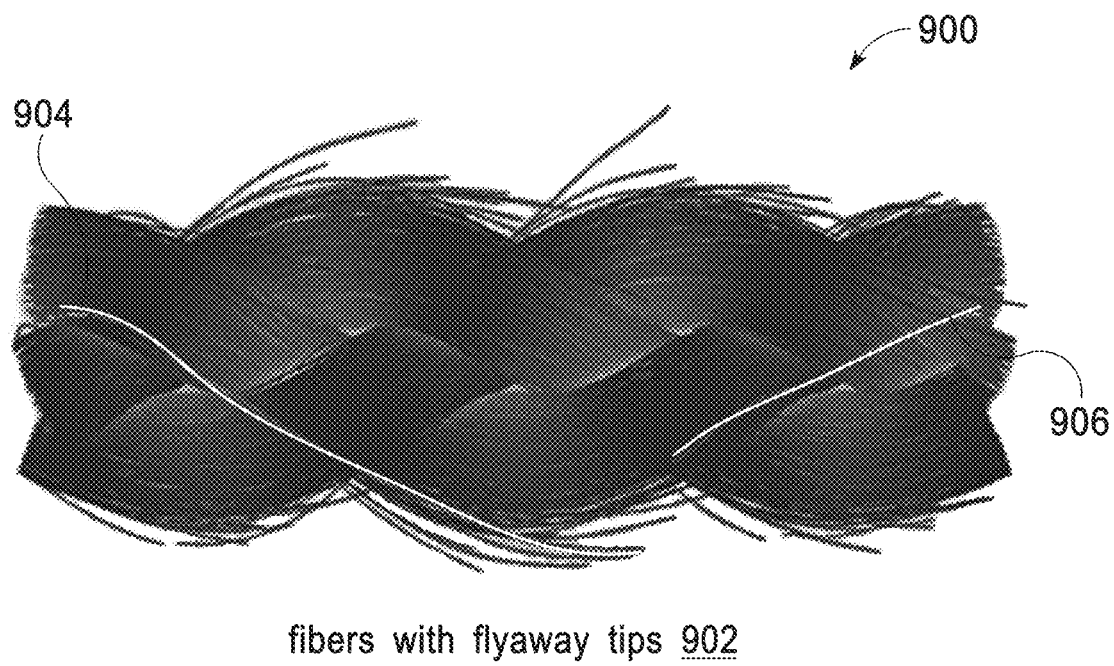
FIG. 9 illustrates a close-up version of braided strands of fibers having individual flyaway fibers in accordance with an embodiment.

FIG. 9 illustrates a close-up version 900 of braided strands of fibers having individual flyaway fibers in accordance with an embodiment. In the vicinity of a flyaway tip, the fiber can be bent away from the braid curve by a random amount as shown in close-up version 900 FIG. 9. Thus, fibers with flyaway tips 902 are shown in close-up version 900, where flyaway tips of different fibers may be shown. In this regard, a first flyaway tip 904 and a second flyaway tip 906 are shown as different flyaway fibers within fibers with flyaway tips 902. For example, underlying fibers may be assigned a position coextensive, proximate, or in overlapping areas with, or within an inner tube corresponding to a strand, and points along each fiber may be computed by interpolating the vertices along the tube. Further, in some embodiments, for each fiber there are two positions that are considered, the positions within the inner strand tube and the positions within an outer flyaway strand tube. In such embodiments, these two positions can be interpolated to generate flyaway fibers, which may be randomized or pseudo-randomized. Thus, first flyaway fiber 904 and second flyaway tip 906 may therefore be formed by interpolating between a first position of a fiber within a first mesh geometric structure for the strand tube and a second position of the fiber associated with a second mesh geometric structure for the flyaway tube.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Further embodiments can be envisioned to one of ordinary skill in the art after reading this disclosure. In other embodiments, combinations or sub-combinations of the above-disclosed invention can be advantageously made. The example arrangements of components are shown for purposes of illustration and it should be understood that combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method for procedurally simulating braided strands of fibers, the computer-implemented method comprising:
   under the control of one or more computer systems configured with executable instructions:
   obtaining a set of parameters of the braided strands of the fibers, the set of parameters indicating a braid spine;
   generating, based at least in part on the set of parameters, a set of interlacing strand spines that follow the braid spine within a tolerance according to the set of parameters;
   computing a set of first geometric structures corresponding to the set of interlacing strand spines;
   determining a set of flyaway tubes comprising a set of second geometric structures surrounding the set of first geometric structures; and
   generating flyaway fibers based on the set of flyaway tubes.

2. The computer-implemented method of claim 1, wherein the set of parameters include a path of the braid spine, a quantity of strands, and a thickness.

3. The computer-implemented method of claim 1, wherein the set of parameters include at least one of a size of a knot of the braided strands of the fibers, a flyaway probability for the flyaway fibers of the fibers along the braided strands of the fibers, or a knot tightness of the braided strands of the fibers.

4. The computer-implemented method of claim 1, wherein computing the set of first geometric structures comprises expanding a tube located along each strand spine of the set of interlacing strand spines until the tube intersects with another tube of a set of tubes associated with the set of interlacing strand spines and/or the tube reaches a tube thickness value specified in the set of parameters.

5. The computer-implemented method of claim 1, further comprising assigning a set of fiber positions for the fibers within each geometric structure of the set of first geometric structures.

6. The computer-implemented method of claim 5, wherein each fiber of the fibers represents a hair within a hair braid corresponding to the braided strands of the fibers.

7. The computer-implemented method of claim 1, wherein generating the flyaway fibers comprises:
assigning an additional set of fibers positions outside the set of first geometric structures but positioned relative to the set of second geometric structures.

8. The computer-implemented method of claim 1, wherein the generating the flyaway fibers is performed according to a stochastic scheme.

9. The computer-implemented method of claim 1, wherein the set of interlacing strand spines comprises three or more interlacing strand spines.

10. The computer-implemented method of claim 1, further comprising generating a graphics output using a computed set of geometric structures corresponding to the set of interlacing strand spines.

11. A computer system for procedurally simulating braided strands of fibers, the computer system comprising:
at least one processor; and
a computer-readable medium storing instructions, which when executed by the at least one processor, causes the computer system to perform the method of claim 1.

12. A non-transitory computer-readable storage medium storing instructions, which when executed by at least one processor of a computer system, causes the computer system to carry out the method of claim 1.

13. A non-transitory computer-readable medium carrying instructions, which when executed by at least one processor of a computer system, causes the computer system to carry out the method of claim 1.

14. A non-transitory carrier medium carrying image data that includes pixel information generated according to the method of claim 1.

* * * * *